US007521678B2

(12) United States Patent
Abe et al.

(10) Patent No.: US 7,521,678 B2
(45) Date of Patent: Apr. 21, 2009

(54) CHARGED PARTICLE BEAM APPARATUS, CHARGED PARTICLE BEAM FOCUSING METHOD, MICROSTRUCTURE MEASURING METHOD, MICROSTRUCTURE INSPECTING METHOD, SEMICONDUCTOR DEVICE MANUFACTURING METHOD, AND PROGRAM

(75) Inventors: Hideaki Abe, Yokohama (JP); Hiroshi Motoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 11/656,953

(22) Filed: Jan. 24, 2007

(65) Prior Publication Data
US 2007/0187599 A1    Aug. 16, 2007

(30) Foreign Application Priority Data
Jan. 24, 2006    (JP)    ............................. 2006-014902

(51) Int. Cl.
*H01J 37/21*    (2006.01)
(52) U.S. Cl. ..................................................... 250/310
(58) Field of Classification Search .................. 250/310
See application file for complete search history.

(56) References Cited

U.S. PATENT DOCUMENTS 4,929,836 A    5/1990    Sicignano et al.
5,302,829 A    4/1994    Komatsu et al.
5,512,747 A *  4/1996    Maeda ........................ 250/310
6,852,973 B2    2/2005    Suzuki et al.

FOREIGN PATENT DOCUMENTS

JP    5-190132    7/1993
JP    7-161327    6/1995

* cited by examiner

*Primary Examiner*—Kiet T Nguyen
(74) *Attorney, Agent, or Firm*—Finnegan, Henderson, Farabow, Garrett & Dunner, L.L.P

(57) ABSTRACT

A charged particle beam apparatus includes: a charged particle source which generates a charged particle beam to apply to a specimen having a microstructure formed on a surface thereof; an objective lens which excites at least one of an electric field and a magnetic field to converge the charged particle beam onto the specimen; a deflector which scans the specimen with the charged particle beam; a detector which detects at least one of a secondary charged particle, a reflection charged particle and a back scattering charged particle generated from the specimen and which outputs a detection signal; a focusing area arranging unit which arranges a plurality of focusing areas including edge points of the microstructure therein in a surface area of the specimen; a deflection controller which controls the deflector so that the focusing areas are sequentially scanned to correspond to excitation conditions while changing stepwise the excitation conditions of the objective lens; a focus calculator which calculates an index indicating a convergence state in each excitation condition on the basis of the detection signal and which calculates an optimum excitation condition providing an optimum focal position from the index; and an objective lens controller which drives the objective lens under the optimum excitation condition.

20 Claims, 8 Drawing Sheets

SET RANGE OF
FOCUSING AREA($\Delta x, \Delta y$)

ACQUIRE LOW-MAGNIFICATION
TWO-DIMENSIONAL SEM IMAGE

EXTRACT EDGE BY
IMAGE PROCESSING

ARRANGE FOCUSING
AREAS IN EDGE POSITION

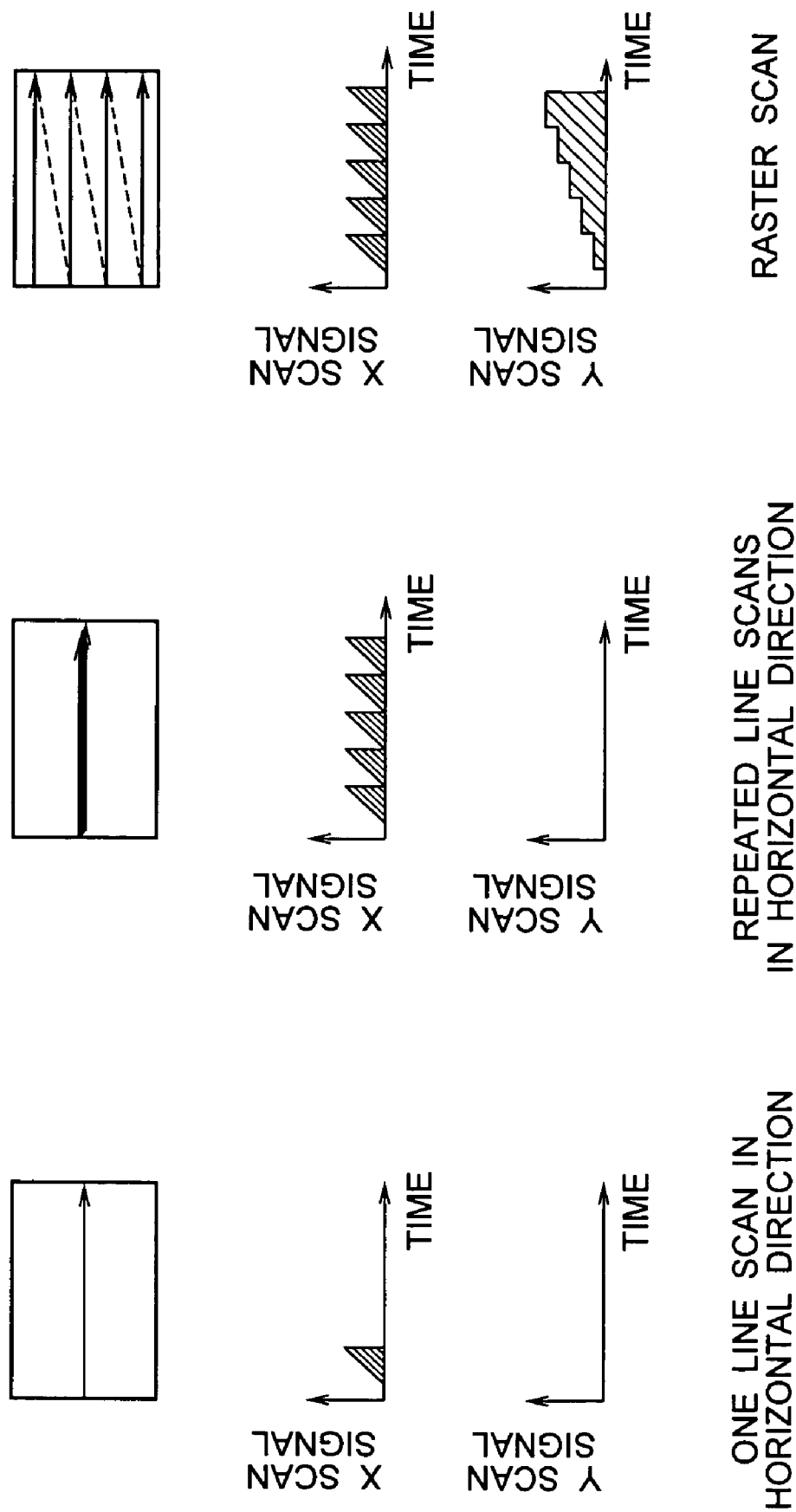

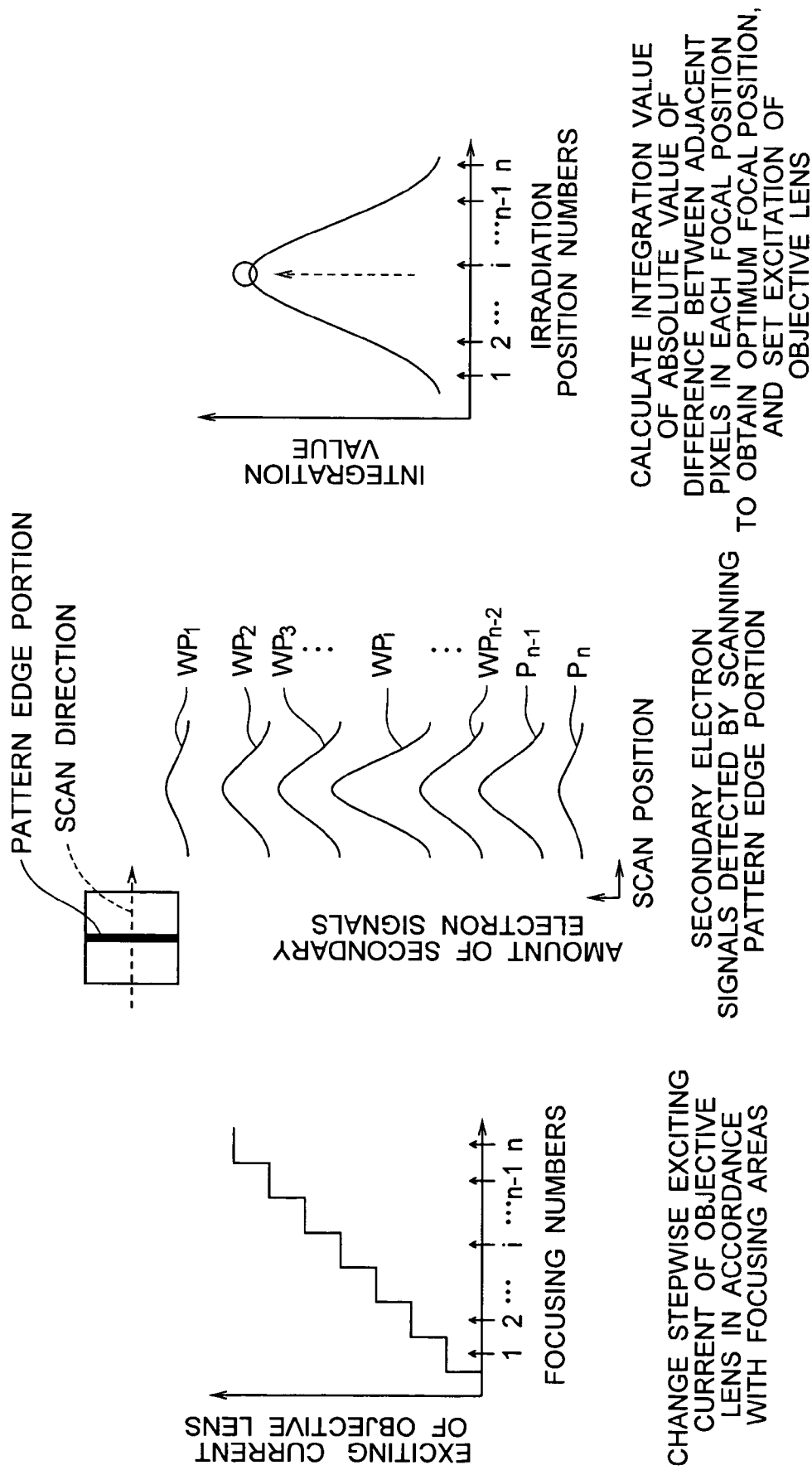

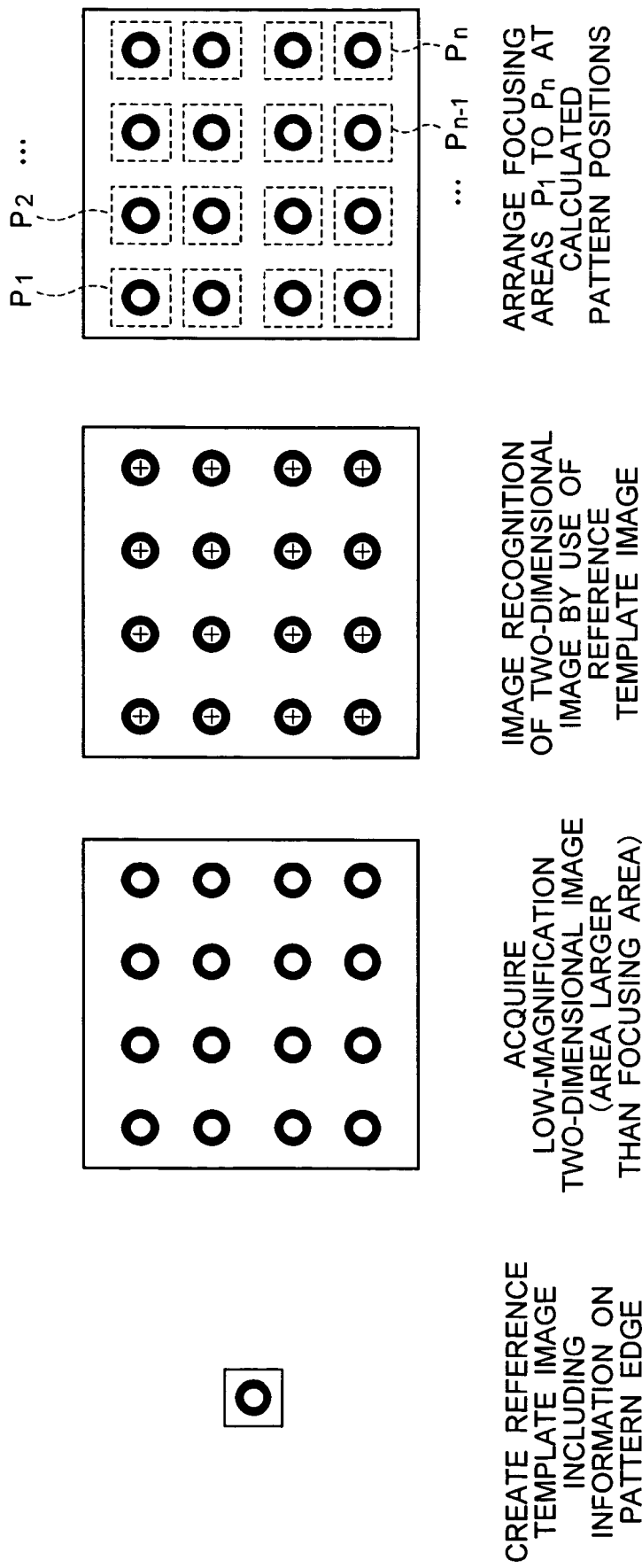

CHARGED PARTICLE BEAM APPARATUS, CHARGED PARTICLE BEAM FOCUSING METHOD, MICROSTRUCTURE MEASURING METHOD, MICROSTRUCTURE INSPECTING METHOD, SEMICONDUCTOR DEVICE MANUFACTURING METHOD, AND PROGRAM

CROSS REFERENCE TO RELATED APPLICATION

This application claims benefit of priority under 35USC §119 to Japanese patent application No. 2006-14902, filed on Jan. 24, 2006, the contents of which are incorporated by reference herein.

BACKGROUND OF THE INVENTION

1. Field of the Invention

The present invention relates to a charged particle beam apparatus, a charged particle beam focusing method, a microstructure measuring method, a microstructure inspecting method, a semiconductor device manufacturing method, and a program. The present invention is directed to, for example, an inspection, observation, etc. of a microstructure such as a semiconductor device, a photomask or liquid crystal device by use of a charged particle beam.

2. Related Background Art

Various charged particle beam apparatuses are used to observe and evaluate a minute pattern of a semiconductor device, and one representative device is a scanning electron microscope (SEM). The scanning electron microscope is used for shape observation such as the observation of the section of a device pattern, and an apparatus with a measurement function to measure the dimensions, etc. of the device pattern during a manufacturing process is particularly called a critical dimension scanning electron microscope (CD-SEM) and widely used as a tool for in-line process evaluation. In the CD-SEM, the accelerating voltage of an electron beam is reduced to 1 kV or less and the amount of a beam current is held down to a pA order to suppress damages to device performance due to electron beam application, thereby enabling the in-line evaluation of the manufacturing process.

However, there are some materials constituting the device which have properties susceptible to the influence of the electron beam application. Typical examples of which include a resist used in photolithography and an insulating film having a low dielectric constant. These materials not only change their qualities due to the electron beam, but also cause shape variations such as a volume shrinkage. Thus, the shape of the device pattern changes in an application area where the electron beam has been applied to carry out a measurement or observation, and there is therefore the possibility that the pattern dimensions and the thickness of the film depart from specified values leading to the deterioration of the device performance. In order to suppress the damages due to the electron beam, the CD-SEM employs an irradiation condition including a lower accelerating voltage and a lower current, and further employs a method which suppresses the dose amount of the electron beam as a result of reconsidering a method of scanning with the electron beam during a measurement or observation. Various measures for reducing the damages have been taken in connection with the method of applying the electron beam for acquiring an image during the measurement or observation.

On the other hand, extremely high accuracy in the measurement of the pattern dimensions has been requested due to the recent miniaturization of device patterns, and higher accuracy of automatic focusing has been required together with a higher resolution of the electron beam, a higher S/N ratio of an image, an improved algorithm for the measurement of pattern dimensions, etc. Several methods can be given as the examples of the methods of focusing the electron beam. For example, there is a method comprising: changing stepwise the convergence conditions of the electron beam every time the same line is scanned; calculating an integration value of an absolute value of the difference or differential of secondary electron signals in each convergence condition; and determining a convergence condition under which the integration value is maximized as a convergence condition for providing an optimum focal position. Further, there is a method comprising: performing a horizontal scan and a vertical scan instead of a line scan to acquire a two-dimensional image corresponding to each convergence condition; and calculating an integration value of an absolute value of the difference or differential of secondary electron signals between pixels in an image to produce a convergence condition for providing an optimum focal position. Still further, there is a method comprising: acquiring an SEM image with a low magnifying power in advance; and scanning it with an electron beam perpendicularly to the edge of the SEM image to search for a focal position (e.g., Japanese Patent Publication Laid-open (kokai) No. 5 (1993)-190132).

However, all the focusing methods mentioned above repeatedly scan the same place while changing the convergence condition of the electron beam, and therefore have a disadvantage that the influence of focusing operation on the device pattern is greater in the case of a material damaged by the application of the electron beam. Actually, as compared with the irradiation amount for acquiring an image for use in, for example, a dimensional measurement, the amount of electrons applied to a specimen tends to be greater in the case of focusing. This is attributed to, for example, processing with a high magnification for higher accuracy of focusing, longer processing time due to more finely cut variations of the convergence condition for accurately calculating the maximum value of the integration value, and a greater number of times of repeated scans per convergence condition for improving the S/N ratio of an image. In addition, information on the edge of a pattern alone is generally used for focusing, but the methods mentioned above cause the damage from irradiation even to places which are not necessary for focusing because the whole area is irradiated.

One method of minimizing the beam application to a specimen is, for example, a technique disclosed in Japanese Patent Publication Laid-open No. 7-161327. The technique in Japanese Patent Publication Laid-open No. 7-161327 provides a method in which the convergence condition is changed synchronously with the vertical scan when a two-dimensional image is acquired. According to this method, the convergence condition is set by a beam scan for one screen, and the maximum of the integration value is calculated from a resulting image, such that an optimum convergence condition can be calculated. However, an offset is provided in the convergence condition to carry out repeated scans when there are a small number of edges of patterns, so that the same place is repeatedly scanned, and the damage to the pattern is increased.

SUMMARY OF THE INVENTION

According to a first aspect of the present invention, there is provided a charged particle beam apparatus comprising:

a charged particle source which generates a charged particle beam and which applies the charged particle beam to a specimen having a microstructure formed on a surface thereof;

an objective lens which excites at least one of an electric field and a magnetic field to converge the charged particle beam onto the specimen;

a deflector which scans the specimen with the charged particle beam;

a detector which detects at least one of a secondary charged particle, a reflection charged particle and a back scattering charged particle generated from the specimen by the application of the charged particle beam and which outputs a detection signal;

a focusing area arranging unit which arranges a plurality of focusing areas including edge points of the microstructure therein in a surface area of the specimen;

deflection controller which controls the deflector so that the focusing areas are sequentially scanned to correspond to excitation conditions while changing stepwise the excitation conditions, the excitation conditions being conditions for the objective lens to excite at least one of the electric field and the magnetic field;

focus calculator which calculates an index indicating a convergence state in each excitation condition on the basis of the detection signal outputted by the detector for the excitation conditions and the focusing areas and which calculates an optimum excitation condition providing an optimum focal position from the obtained index; and an objective lens controller which drives the objective lens under the optimum excitation condition.

According to a second aspect of the present invention, there is provided a charged particle beam focusing method for use in a charged particle beam apparatus, the charged particle beam apparatus generating a charged particle beam and then converging the charged particle beam by at least one of an electric field and a magnetic field, scanning a specimen having a microstructure formed on a surface thereof with the charged particle beam and detecting at least one of a secondary charged particle, a reflection charged particle and a back scattering charged particle generated from the specimen to output a detection signal, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

According to a third aspect of the present invention, there is provided a method of measuring a microstructure formed on the surface of a specimen, which method includes measuring the microstructure by use of a charged particle beam focusing method, the charged particle beam focusing method being used in a charged particle beam apparatus, the charged particle beam apparatus generating a charged particle beam and then converging the charged particle beam by at least one of an electric field and a magnetic field, scanning a specimen to detect at least one of secondary charged particles, reflection charged particles and back scattering charged particles generated from the specimen, and outputting a detection signal, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal, and calculating an optimum excitation condition providing an optimum focal position from the obtained index; and converging the charged particle beam on the specimen under the optimum excitation condition.

According to a fourth aspect of the present invention, there is provided a method of inspecting a microstructure formed on a surface of a specimen, which method includes inspecting the microstructure by use of a charged particle beam focusing method, the charged particle beam focusing method being used for a charged particle beam apparatus, the charged particle beam apparatus generating a charged particle beam and then converging the charged particle beam by at least one of an electric field and a magnetic field, scanning a specimen to detect at least one of a secondary charged particle, a reflection charged particle and a back scattering charged particle generated from the specimen, and outputting a detection signal, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

According to a fifth aspect of the present invention, there is provided a semiconductor device manufacturing method to manufacture a semiconductor device using a charged particle beam focusing method for use in a charged particle beam apparatus, the charged particle beam apparatus generating a charged particle beam and then converging the charged particle beam by at least one of an electric field and a magnetic field, scanning a specimen having a microstructure formed on a surface thereof with the charged particle beam and detecting at least one of a secondary charged particle, a reflection charged particle and a back scattering charged particle generated from the specimen to output a detection signal, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

According to a sixth aspect of the present invention, there is provided a program for a charged particle beam apparatus comprising a control computer, the program being stored in a medium readable by the control computer of the charged particle beam apparatus, the charged particle beam apparatus generating a charged particle beam and then converging the charged particle beam by at least one of an electric field and a magnetic field, scanning a specimen having a microstructure formed on a surface thereof and detecting at least one of a secondary charged particle, a reflection charged particle and a back scattering charged particle generated from the specimen to output a detection signal, the program causing the control computer to execute a charged particle beam focusing method, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

BRIEF DESCRIPTION OF THE DRAWINGS

In the accompanying drawings:

FIGS. 4A to 4C are explanatory diagrams showing specific examples of methods of scanning the focusing area;

FIGS. 5A to 5C are explanatory diagrams showing one example of the focusing method in which an optimum focal position is calculated while the excitation of an objective lens is changed;

FIGS. 8A to 8D are explanatory diagrams showing one example of a method of arranging focusing areas in the positions of patterns having a characteristic shape.

DETAILED DESCRIPTION OF THE INVENTION

Embodiments of the present invention will hereinafter be described with reference to the drawings.

(1) Charged Particle Beam Apparatus

Figure 1:
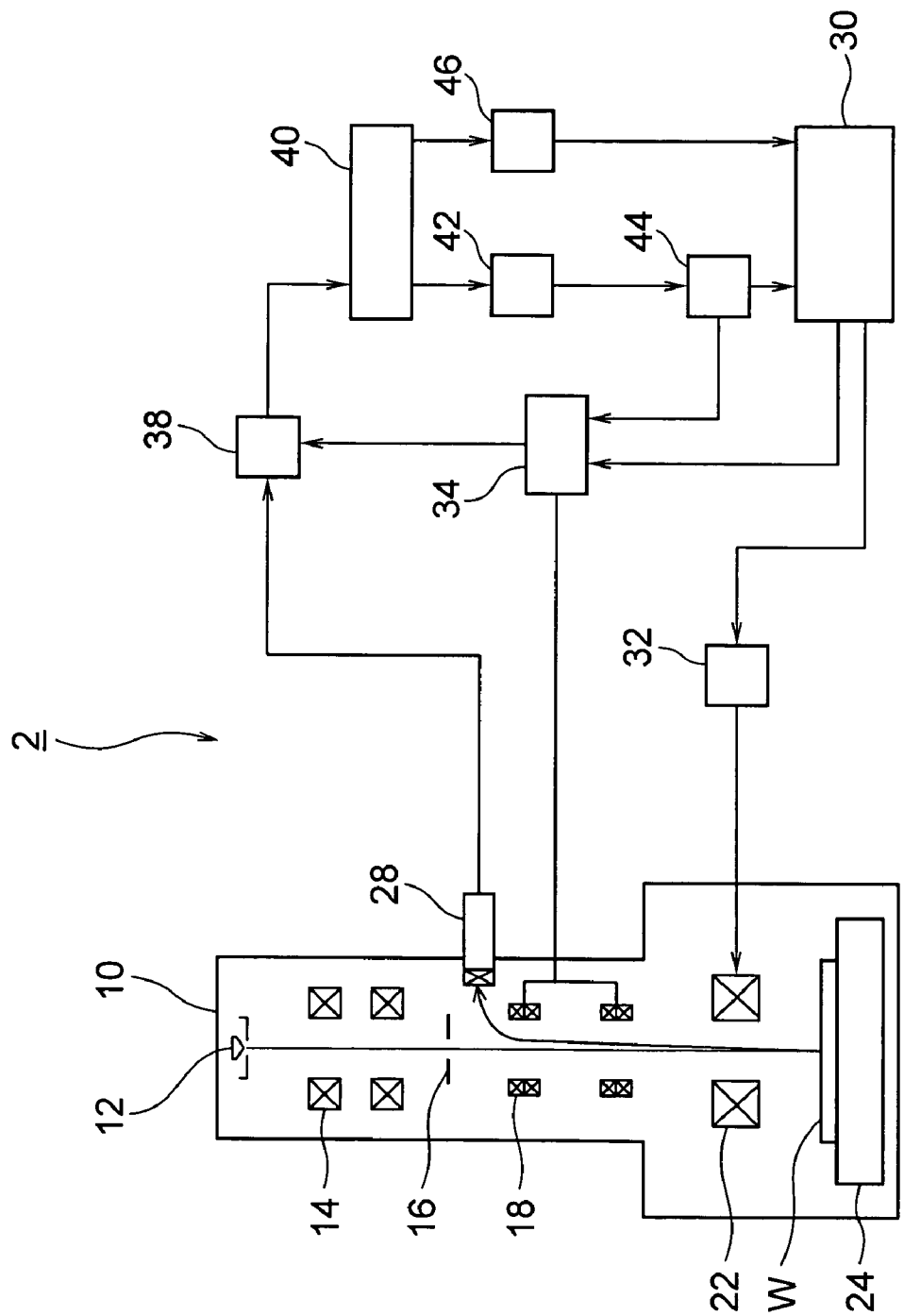
FIG. 1 is a block diagram showing a schematic configuration in one embodiment of a charged particle beam apparatus according to the present invention.

FIG. 1 is a block diagram showing a schematic configuration in one embodiment of a charged particle beam apparatus according to the present invention. An electron beam apparatus 2 shown in FIG. 1 comprises an electron beam column 10, a main controller 30, an objective lens controller 32, a scan controller 34, an image converter 38, an image memory 40, an edge extractor 42, a focus calculator 46, and a focusing area arranger 44. The main controller 30 is configured by, for example, a control computer.

The electron beam column 10 includes an electron gun 12, a condenser lens 14, an aperture 16, a deflector 18, an objective lens 22, a stage 24, and a secondary electron detector 28. A wafer W which is a specimen having a pattern as a microstructure formed on a surface thereof is mounted on the stage 24.

An electron beam EB emitted from the electron gun 12 is converged by the condenser lens 14, and has the size of its sectional area adjusted by the aperture 16, and then enters the objective lens 22. The objective lens 22 excites a magnetic field in the present embodiment to converge the electron beam EB so that the electron beam EB is imaged on the surface of the wafer W by this magnetic field. The converged electron beam EB is deflected by the scan deflector 18 which receives a control signal from the scan controller 34, and the wafer W is scanned with the electron beam EB. The scan deflector 18 scans the wafer W with the electron beam EB in accordance with a scan signal generated in and sent from the scan controller 34 on the basis of a command signal from the main controller 30.

Due to the scan with the electron beam EB, secondary electrons, reflection electrons and back scattering electrons (hereinafter referred to as "secondary electrons, etc.") SE are released from the surface of the wafer W. The released secondary electrons, etc. SE pass through the objective lens 22 while being accelerated by the magnetic field formed between the wafer W and the objective lens 22, and then enter the secondary electron detector 28. The secondary electron detector 28 outputs a detection signal indicating the amount of the detected secondary electrons, etc. SE to the image converter 38, and the image converter 38 converts the detection signal received from the secondary electron detector 28 into an image signal while synchronizing with the scan signal sent from the scan controller 34 and then stores the image signal as an SEM image in the image memory 40. The edge extractor 42 takes the SEM image out of the image memory 40 to extract an edge, and supplies information on the position of the edge to the scan controller 34 and the focusing area arranger 44. The focusing area arranger 44 sets a pattern shape suitable for focusing from the supplied edge position information, arranges areas for focusing (hereinafter referred to as "focusing areas") in a surface area of the wafer W, and supplies information on the arrangement to the main controller 30. The main controller 30 generates a command signal on the basis of information on the arrangement of the focusing areas sent from the focusing area arranger 44, and then supplies the command signal to the scan controller 34. In accordance with the command signal from the main controller 30, the scan controller 34 generates a scan signal for the focusing areas arranged in the surface area of the wafer W by the focusing area arranger 44. The focus calculator 46 calculates an index indicating the convergence state of the electron beam EB from the image signal of the SEM image obtained by the scan of the focusing area, and supplies an index indicating an optimum excitation condition of the objective lens to the main controller 30. The main controller 30 generates a command signal on the basis of the index supplied from the focus calculator 46 and then supplies the command signal to the objective lens controller 32, and the objective lens controller 32 sets an exciting current corresponding to the optimum excitation condition in accordance with the command signal sent from the main controller 30.

The operation of the electron beam apparatus 2 shown in FIG. 1 will be described below as an embodiment of a charged particle beam focusing method according to the present invention with reference to FIG. 2 to FIG. 8.

(2) Charged Particle Beam Focusing Method (i) First Embodiment

Figure 2:
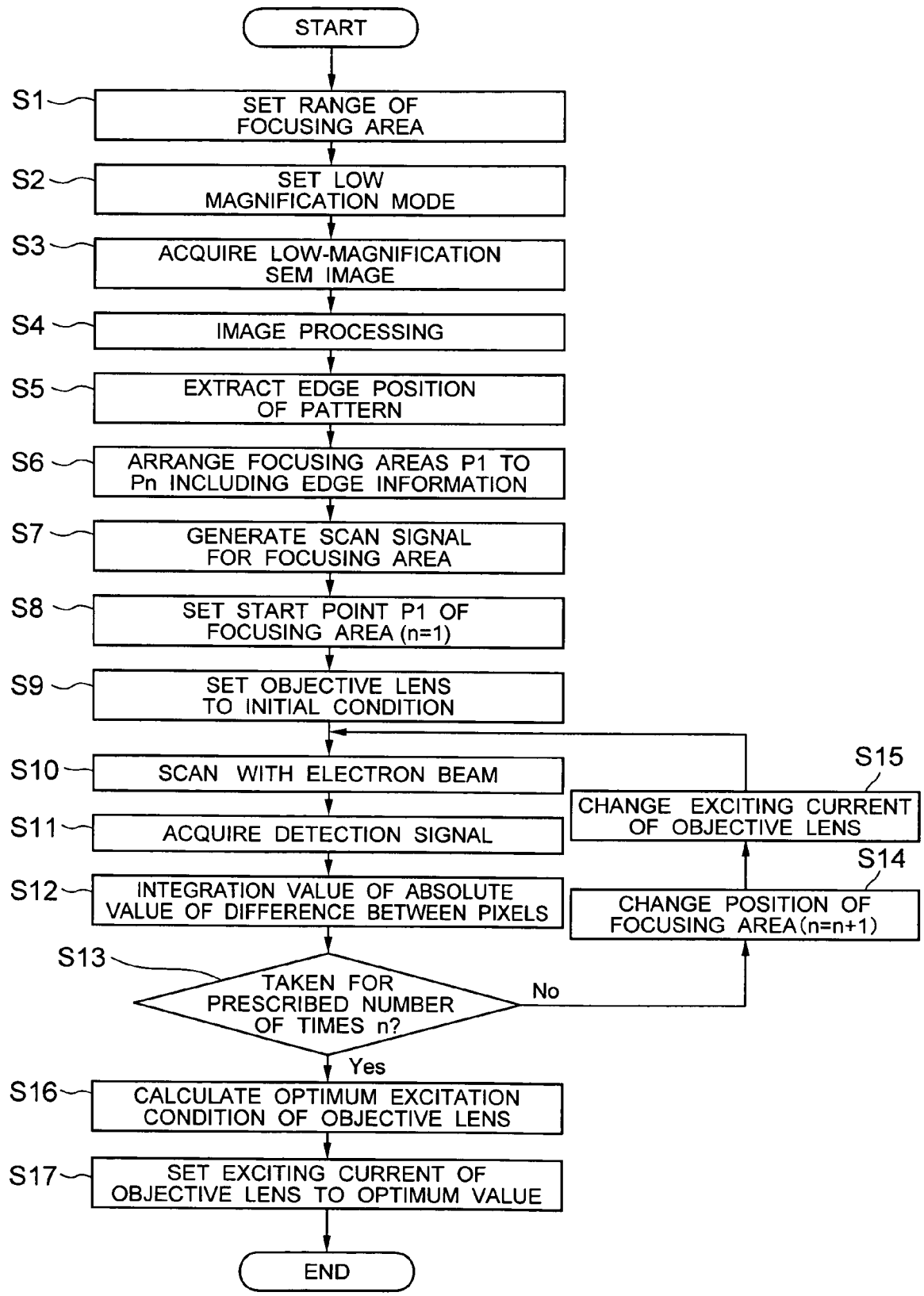
FIG. 2 is a flowchart showing specific procedures in a first embodiment of a focusing method according to the present invention.
Figure 6:
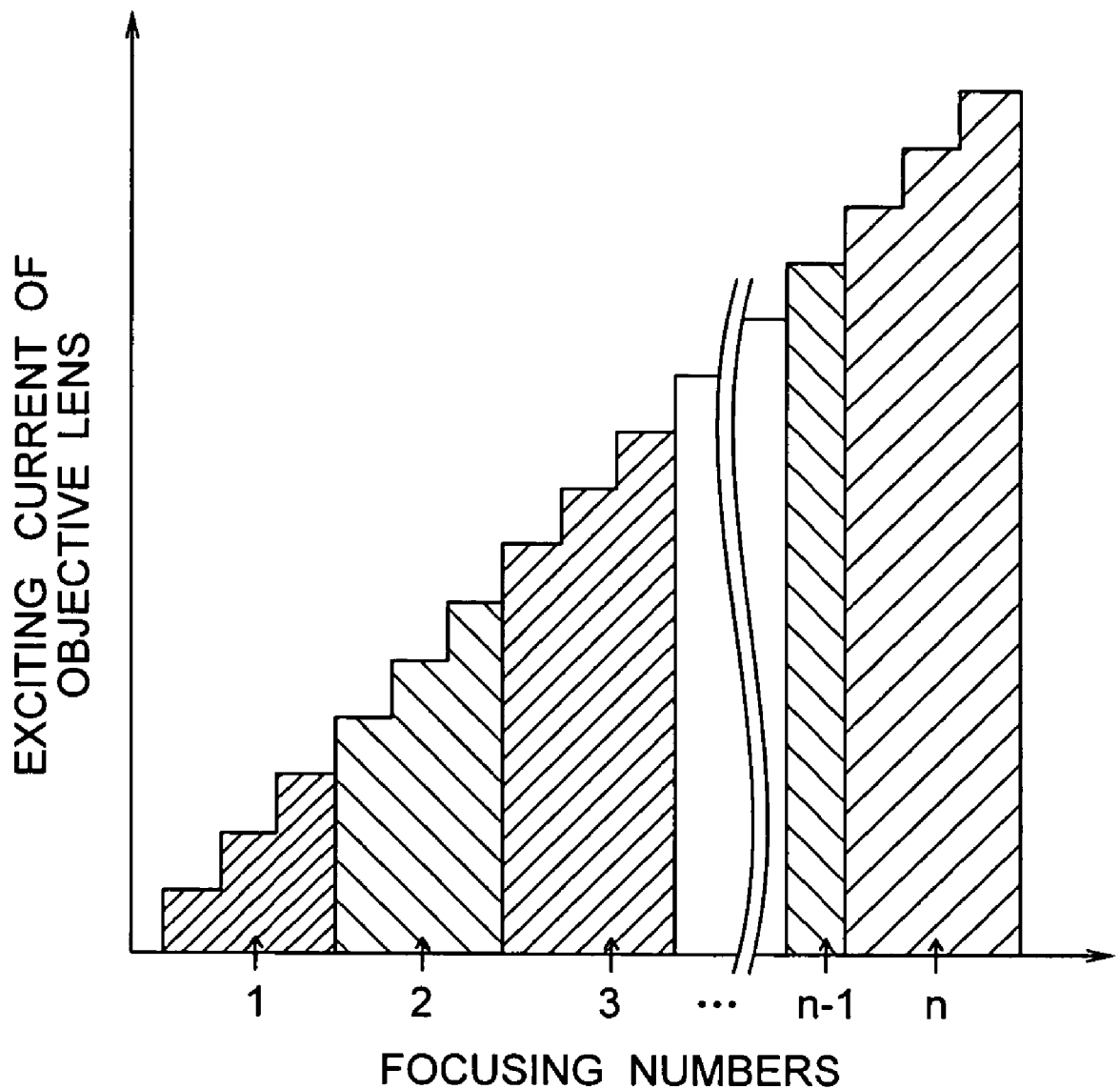
FIG. 6 is an explanatory diagram of a method of processing by excitations under a plurality of conditions in each of the focusing areas.

FIG. 2 is a flowchart showing specific procedures in a first embodiment of a focusing method according to the present invention. FIGS. 3A to 3D are explanatory diagrams showing one example of the arrangement of focusing areas in an edge position. FIGS. 4A to 4C are explanatory diagrams showing specific examples of methods of scanning the focusing area. FIGS. 5A to 5C are explanatory diagrams showing one example of the focusing method to calculate an optimum focal position while changing an exciting current of an objective lens. FIG. 6 is an explanatory diagram of a method of processing by excitations under a plurality of conditions in each of the focusing areas.

Figure 3A:
FIGS. 3A to 3D are explanatory diagrams showing one example of a method of arranging focusing areas in an edge position.

First, the range of the focusing area is set (FIG. 2, step S1). A schematic diagram of the focusing area is shown in FIG. 3A. The range of this area is defined by a horizontal size ($\Delta x$) and a vertical size ($\Delta y$).

When the electron beam EB is only applied to the edge of the pattern, the range of the focusing area is set smaller so that the electron beam EB is only applied to the vicinity of the edge of the pattern. Such a restriction of the focusing area to the vicinity of the edge of the pattern prevents the electron beam EB from being applied to unwanted areas and makes it possible to set a high magnification during focusing, such that there is an effect of improving the accuracy of focusing.

Figure 3B:
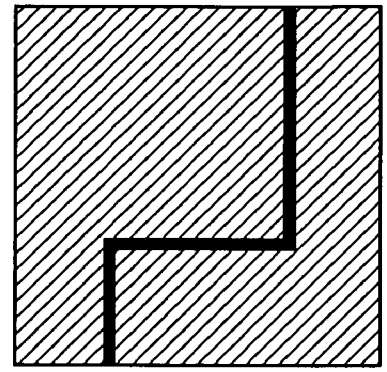

Subsequently, an SEM is set to a low magnification mode (FIG. 2, step S2). Here, the magnification is set so as to obtain an SEM image of an area larger than the focusing area. The electron beam EB is generated at the set magnification, and a two-dimensional SEM image is acquired by horizontally and vertically scanning the pattern (step S3) and stored in the image memory 40. A schematic diagram of the obtained SEM image is shown in FIG. 3B.

It is to be noted that the electron beam EB needs to be roughly focused to the extent that the edge of the pattern can be recognized when the SEM image is acquired. An optical height gauge (not shown) can be used for this focusing. It is also possible to set excitation conditions of the objective lens at a low magnification to integrate an absolute value of the difference between pixels of the two-dimensional image obtained under each excitation condition, and set an exciting current of the objective lens in the vicinity of the optimum focal position on the basis of the integration value.

Next, the edge extractor 42 takes the obtained SEM image from the image memory 40 to subject the SEM image to predetermined image processing (FIG. 2, step S4), and extracts the edge position of the pattern (step S5).

Figure 3C:
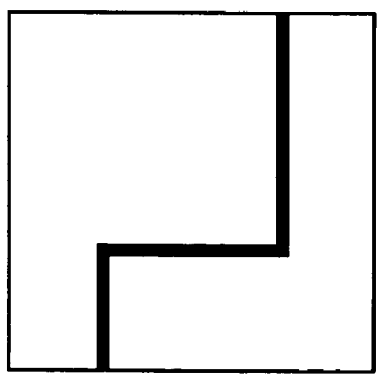

In general, since the SEM image has much noise, binary processing, a Sobel filter, etc. are applied to the SEM image after smoothing processing when the edge position is extracted. A schematic diagram of the extracted pattern edge is shown in FIG. 3C.

Figure 3D:
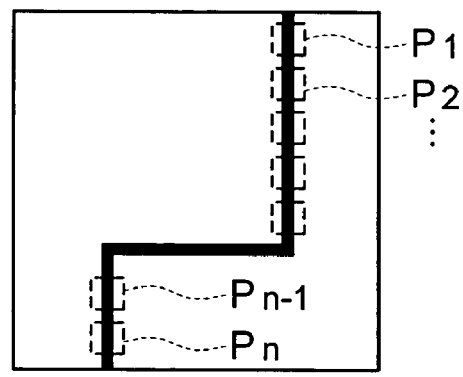

Next, the focusing area arranger 44 sets a pattern shape suitable for focusing on the basis of information on the obtained edge position to arrange the focusing areas in the surface area of the wafer W (FIG. 2, step S6). The pattern shape suitable for focusing in the SEM image includes a shape corresponding to a longitudinal edge portion, for example, when a lateral scan with the electron beam EB is performed. Since the change in the intensity of a detected secondary electron signal is sharper in a pattern edge portion perpendicular to a scan direction than in a pattern edge portion parallel to the scan direction, the focusing areas are arranged around the longitudinal pattern edge portion when the lateral scan with the electron beam EB is performed. Moreover, in the case of an image containing complicated longitudinal and lateral pattern edges rather than a simple linear pattern, it is advantageous if a place containing much edge information in the range of the initially set focusing area is extracted to arrange the focusing areas therein. If several methods of arranging the focusing areas are previously set in the focusing area arranger 44, the arrangement of the focusing areas suitable to the pattern is possible. FIG. 3D shows a case where attention is paid particularly on a pattern edge portion perpendicular to a horizontal scan with the electron beam EB, so that the focusing areas are arranged in the position of this edge. Here, a focusing area P1 is first set beginning with the edge position in the vicinity of the upper edge of the SEM image, and focusing areas P2, P3 . . . Pn are sequentially set with the movement toward the lower edge thereof along the edge at a predetermined pitch corresponding to the size of the area P1. Here, n is a quantity corresponding to the total number of steps of the excitation of the objective lens 22. In the present embodiment, the focusing areas P1 to Pn are arranged in order from the upper edge to the lower edge of the SEM image, but it is desirable to arrange the focusing areas randomly or so as to prevent them from adjoining each other because the material tends to be more easily damaged if the adjacent areas are irradiated with the electron beam EB.

Next, the scan controller 34 generates a scan signal for the focusing areas arranged by the focusing area arranger 44, on the basis of the command signal from the main controller 30 (FIG. 2, step S7). This scan signal is decided by the horizontal and vertical sizes of the focusing area, the number of times of scans under the same excitation condition, the selection of a line scan or a raster scan, etc.

Three specific examples are shown in FIGS. 4A to 4C as methods of scanning with the electron beam EB in the focusing area. As shown in FIG. 4A, the method causing the least damage to the specimen is the method which performs only one line scan in a horizontal direction in the focusing area. However, the method with only one scan has the possibility of accuracy deterioration because of the small amount of secondary electron signals from the specimen. Therefore, as shown in FIG. 4B, the use of an image signal integrated by repeated line scans makes it possible to obtain an index indicating a high-speed and accurate convergence state. Moreover, as shown in the example shown in FIG. 4C, performing a raster scan by horizontal and vertical scans makes it possible to obtain a two-dimensional image signal, so that the stability of the index indicating the convergence state is greatly improved. Stable focusing with little damage is possible by selecting a proper method in accordance with the shape and arrangement form of a microstructure to be targeted for a measurement or inspection, the materials of a substance forming the microstructure, etc.

Next, the scan controller 34 sets a start point of the focusing area (FIG. 2, step S8), and sets the excitation condition of the objective lens 22 to an initial state (step S9). For example, in the example shown in FIG. 3D, the focusing area P1 is set as the start point. Further, as shown in FIG. 5A, the main controller 30 generates a control signal so as to change the focusing area every time the exciting current of the objective lens 22 is changed stepwise by a given amount, and then supplies the control signal to the scan controller 34, and the scan controller 34 generates a scan signal for the set focusing area so that scanning with the electron beam EB is performed by the scan deflector 18 (FIG. 2, steps S10 to S15). FIG. 5B shows the amount of the secondary electron signals when the scan is performed perpendicularly to the edge of the pattern. In FIG. 5B, a horizontal axis indicates horizontal scanning positions, and a vertical axis indicates the amount of the secondary electron signals. Waveforms indicated by signs WP1 to WPn show the amounts of the secondary electron signals in the focusing areas P1 to Pn. In the example shown in FIG. 5B, the state of the waveform WP1 is out of focus, and the amount of the secondary electron signals from the edge is therefore small. However, along with WP2, WP3 and so on gradually coming into focus, the secondary electron signals of the edge portion show a sharp increase, and the increase becomes the sharpest in a certain focusing area P1. Subsequently, defocusing starts again, and the amount of the secondary electron signals becomes smaller again.

Next, the focus calculator 46 takes out of the image memory 40 the SEM image obtained by scanning the focusing area, and calculates an index indicating a convergence state from an image signal of the SEM image (FIG. 2, step S12). In the case of the waveform of the secondary electron signal by the line scan, an integration value of an absolute value of the difference or differential of signal intensities between pixels adjacent in a horizontal scan direction is calculated. In the case of the secondary electron signal by the raster scan, an integration value of an absolute value of the difference or differential of signal intensities between two-dimensionally adjacent pixels is calculated. This processing is performed for all the focusing areas P1 to Pn, that is, for n corresponding to the prescribed number of times compliant with the excitation condition of the objective lens (steps S13 to S15), and the focus calculator 46 calculates the maximum value of the integration value of the absolute value of the difference or differential of the signal intensities as the index indicating the convergence state (step S16). FIG. 5C shows a state in which the integration value in the focusing area Pi is maximized. The excitation condition corresponding to the index thus calculated indicates the optimum excitation condition of the objective lens. The objective lens controller 32 sets an exciting current corresponding to the optimum excitation condition calculated by the focus calculator 46 and sent via the main controller 30 (step S17). This permits the focus of the electron beam EB to be adjusted to the optimum position.

Furthermore, when the number of focusing areas P1 to Pn is smaller (n is smaller) than the number of steps of the excitation of the objective lens 22, the processing may be performed in the focusing areas P1 to Pn under a plurality of excitation conditions, as shown in FIG. 6. This makes it possible to drastically decrease the amount of irradiation with the electron beam EB as compared with the case where all the excitation conditions are processed in the same focusing area. For example, in the case of three focusing areas, focusing can be completed with one third of the irradiation amount to be processed in the case of one focusing area.

(ii) Second Embodiment

Figure 7:
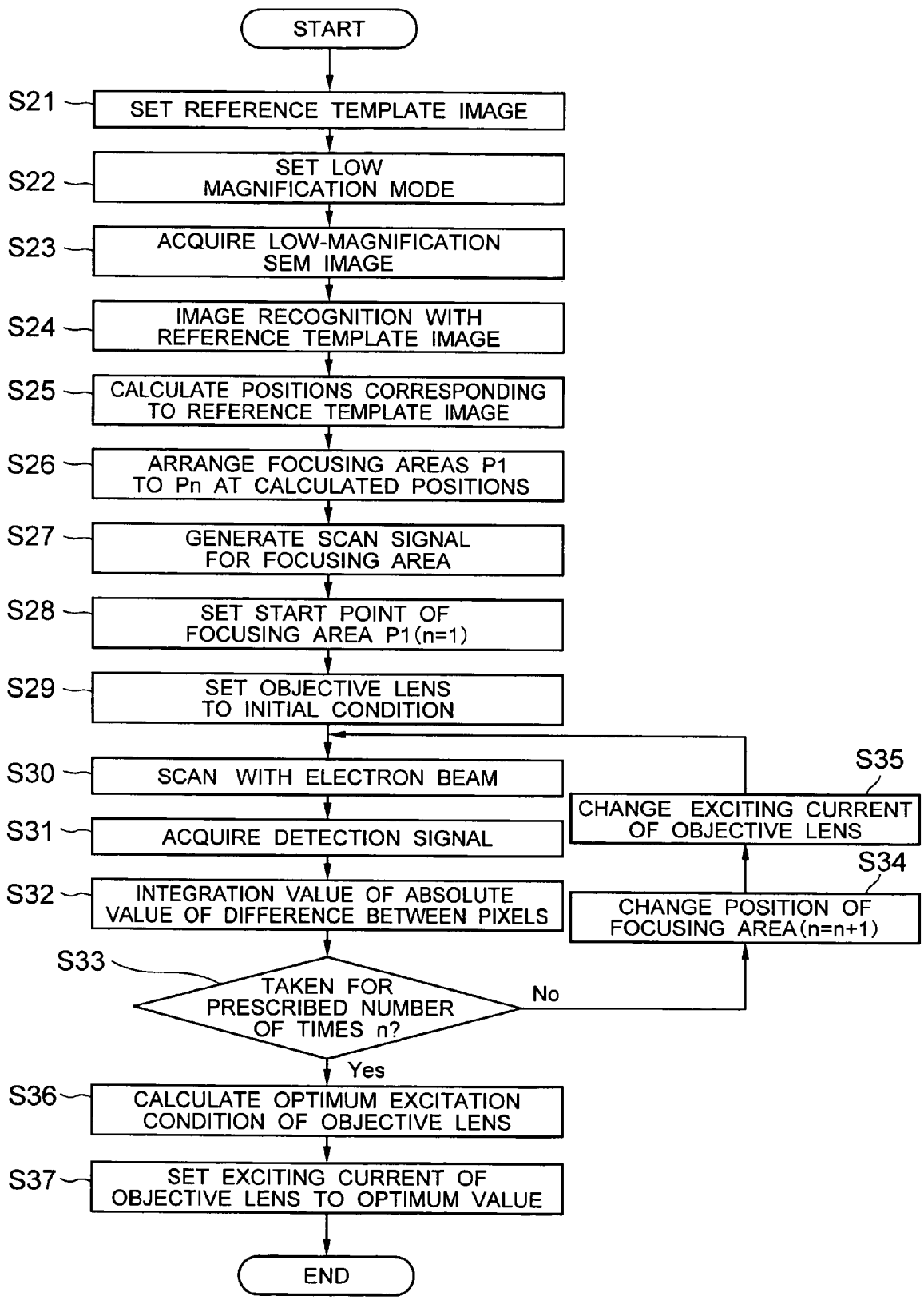
FIG. 7 is a flowchart showing specific procedures in a second embodiment of a focusing method according to the present invention.

While focusing areas are set in the positions of a pattern edge in the first embodiment described above, the present embodiment is characterized in that the focusing areas are set not in the edge positions but in patterns having a characteristic shape. This enables an arbitrary pattern shape to be focused. FIG. 7 shows a flowchart showing specific procedures in the present embodiment, and FIGS. 8A to 8D show one example of a method of arranging focusing areas in the positions of the pattern having the characteristic shape. In the procedures shown in FIG. 7, the procedures shown in step numbers S21, S24 to S26 are characteristic procedures in the present embodiment, and other procedures are substantially the same as the procedures shown in FIG. 2, and these correspond to the step numbers in FIG. 2 to which 20 is added. Therefore, the procedures different from those in FIG. 2 are mainly described below.

First, a pattern having a characteristic shape to be focused is set as a reference template image (FIG. 7, step S21). An arbitrary pattern shape can be registered as this image in advance on an SEM, or this image can be created on the basis of design information by, for example, computer aided design (CAD) and then registered. Here, a hole pattern shown in FIG. 8A as a characteristic pattern shape will be described as a specific example. Using such a reference template image makes it possible to easily set focusing areas P1 to Pn.

Next, as in the first embodiment, a low magnification mode is set to acquire a two-dimensional image with a low magnification (FIG. 7, steps S21 and S22). Here, as shown in FIG. 8B, it is assumed that a low-magnification image in which hole patterns are regularly arranged has been acquired. Then, the acquired low-magnification image is subjected to image recognition using the reference template image (FIG. 7, step S24), and a position corresponding to the reference template image is calculated (step 525). A result of the image recognition for the low-magnification image in FIG. 8B using the reference template image in FIG. 8A is shown in FIG. 8C. In FIG. 8C, cross marks written in the centers of the hole patterns indicate positions corresponding to the reference template image.

Next, as shown in FIG. 8D, the focusing areas P1 to Pn are arranged at the positions corresponding to the reference template image (FIG. 7, step S26). In this manner, the arbitrary pattern shape set with the reference template image can be focused while changing the excitation condition of the objective lens 22 and the focusing areas P1 to Pn having the arbitrary pattern shape (FIG. 7, steps 527 to S37). The present embodiment provides a method particularly effective for the hole patterns as in FIG. 8 and repetitive patterns.

(3) Microstructure Measuring Method

By using the charged particle beam focusing method described above for the measurement of a microstructure, focusing processing can be implemented not for the same place on the microstructure but for focusing places which are sequentially changed in accordance with convergence conditions, so that it is possible to measure the dimensions of the pattern with high accuracy while suppressing changes in the shape of a pattern such as the microstructure and the modification of a material.

(4) Microstructure Inspecting Method

By using the charged particle beam focusing method described above for a defect inspection, focusing processing can be implemented not for the same place on a microstructure but for places which are sequentially changed in accordance with convergence conditions, so that damages to the microstructure which is an inspection target are spread and reduced, and shape changes and material modifications are suppressed, thereby enabling an accurate defect inspection.

(5) Semiconductor Device Manufacturing Method

It is possible to manufacture a semiconductor device with a high yield and a short turn around time (TAT) by employing, in a process of manufacturing the semiconductor device, at least one of the charged particle beam focusing method, the microstructure measuring method and the microstructure inspecting method using the charged particle beam focusing method described above.

(6) Program

At least one of the charged particle beam focusing method, the microstructure measuring method and the microstructure inspecting method using the charged particle beam focusing method described above may be loaded as a program in the form of a recipe file into a memory of a charged particle beam apparatus. Thus, at least one of the charged particle beam focusing method, the microstructure measuring method and the microstructure inspecting method using the charged particle beam focusing method described above can be executed by a general charged particle beam apparatus including a control computer.

While the embodiments of the present invention have been described above, it should be understood that the present invention is not limited to the embodiments described above, and various modifications can be made within the technical scope thereof. For example, the case has been described in the above embodiments where the electron beam is used as a charged particle beam, but the present invention is not limited thereto, and the present invention can also be applied to, for example, an ion beam. Moreover, the magnetic objective lens 22 has been described as an example of an objective lens, but the present invention is not limited thereto, and it is also possible to use an electrostatic or electromagnetic/magnetic superposed lens.

What is claimed is:

1. A charged particle beam apparatus comprising:
    a charged particle source which generates a charged particle beam and which applies the charged particle beam to a specimen having a microstructure formed on a surface thereof;
    an objective lens which excites at least one of an electric field and a magnetic field to converge the charged particle beam onto the specimen;
    a deflector which scans the specimen with the charged particle beam;
    a detector which detects at least one of a secondary charged particle, a reflection charged particle and a back scattering charged particle generated from the specimen by the application of the charged particle beam and which outputs a detection signal;
    a focusing area arranging unit which arranges a plurality of focusing areas including edge points of the microstructure therein in a surface area of the specimen;
    deflection controller which controls the deflector so that the focusing areas are sequentially scanned to correspond to excitation conditions while changing stepwise the excitation conditions, the excitation conditions being conditions for the objective lens to excite at least one of the electric field and the magnetic field;
    focus calculator which calculates an index indicating a convergence state in each excitation condition on the basis of the detection signal outputted by the detector for the excitation conditions and the focusing areas and which calculates an optimum excitation condition providing an optimum focal position from the obtained index; and
    an objective lens controller which drives the objective lens under the optimum excitation condition.

2. The charged particle beam apparatus according to claim 1,
    wherein the deflection controller controls the deflector so that the focusing areas are scanned by a line scan; and
    the focus calculator calculates, as the index, an integration value of an absolute value of a difference or an integration value of an absolute value of a differential of the intensities of the detection signals between pixels adjacent to each other in a horizontal scan direction.

3. The charged particle beam apparatus according to claim 1,
    wherein the deflection controller controls the deflector so that the focusing areas are scanned by a raster scan; and
    the focus calculator calculates, as the index, an integration value of an absolute value of a difference or an integration value of an absolute value of a differential of the intensities of the detection signals between two-dimensionally adjacent pixels.

4. The charged particle beam apparatus according to claim 1,
    wherein the focusing area arranging unit arranges the focusing areas so that the focusing areas do not adjoin each other.

5. A charged particle beam focusing method for use in a charged particle beam apparatus, the charged particle beam apparatus generating a charged particle beam and then converging the charged particle beam by at least one of an electric field and a magnetic field, scanning a specimen having a microstructure formed on a surface thereof with the charged particle beam and detecting at least one of a secondary charged particle, a reflection charged particle and a back scattering charged particle generated from the specimen to output a detection signal, the charged particle beam focusing method comprising:
    arranging a plurality of focusing areas including edge points of the microstructure therein in a surface area of the specimen;
    sequentially scanning the focusing areas with the charged particle beam to correspond to excitation conditions while changing stepwise the excitation conditions, the excitation conditions being conditions to excite at least one of the electric field and the magnetic field;
    acquiring the detection signals for the excitation conditions and the focusing areas;
    calculating an index indicating a convergence state of the charged particle beam in each excitation condition on the basis of the detection signal and calculating an optimum excitation condition providing an optimum focal position from the obtained index; and
    converging the charged particle beam on the specimen under the optimum excitation condition.

6. The charged particle beam focusing method according to claim 5,
wherein the focusing areas are scanned by a line scan; and
the index is an integration value of an absolute value of a difference or an integration value of an absolute value of a differential of the intensities of the detection signals between pixels adjacent to each other in a horizontal scan direction.

7. The charged particle beam focusing method according to claim 5,
wherein the focusing areas are scanned by a raster scan; and
the index is an integration value of an absolute value of a difference or an integration value of an absolute value of a differential of the intensities of the detection signals between two-dimensionally adjacent pixels.

8. The charged particle beam focusing method according to claim 5, further comprising:
preparing a reference template image in advance; and
applying the charged particle beam to the specimen at a low magnification to acquire a low-magnification image of the specimen,
wherein arranging the focusing areas in the surface area of the specimen includes implementing an image recognition of the low-magnification image by use of the reference template image and arranging the focusing areas at positions corresponding to the reference template image in the low-magnification image.

9. A method of measuring a microstructure formed on the surface of a specimen, which method includes measuring the microstructure by use of a charged particle beam focusing method, the charged particle beam focusing method being used in a charged particle beam apparatus, the charged particle beam apparatus generating a charged particle beam and then converging the charged particle beam by at least one of an electric field and a magnetic field, scanning a specimen to detect at least one of secondary charged particles, reflection charged particles and back scattering charged particles generated from the specimen, and outputting a detection signal, the charged particle beam focusing method comprising:
arranging a plurality of focusing areas including edge points of the microstructure therein in a surface area of the specimen;
sequentially scanning the focusing areas with the charged particle beam to correspond to excitation conditions while changing stepwise the excitation conditions, the excitation conditions being conditions to excite at least one of the electric field and the magnetic field;
acquiring the detection signals for the excitation conditions and the focusing areas;
calculating an index indicating a convergence state of the charged particle beam in each excitation condition on the basis of the detection signal, and calculating an optimum excitation condition providing an optimum focal position from the obtained index; and
converging the charged particle beam on the specimen under the optimum excitation condition.

10. The method of measuring a microstructure according to claim 9,
wherein the focusing areas are scanned by a line scan; and
the index is an integration value of an absolute value of a difference or an integration value of an absolute value of a differential of the intensities of the detection signals between pixels adjacent to each other in a horizontal scan direction.

11. The method of measuring a microstructure according to claim 9,
wherein the focusing areas are scanned by a raster scan; and
the index is an integration value of an absolute value of a difference or an integration value of an absolute value of a differential of the intensities of the detection signals between two-dimensionally adjacent pixels.

12. The method of measuring a microstructure according to claim 9,
wherein the charged particle beam focusing method further comprises preparing a reference template image in advance and applying the charged particle beam to the specimen at a low magnification to acquire a low-magnification image of the specimen, and
wherein arranging the focusing areas in the surface area of the specimen includes implementing an image recognition of the low-magnification image by use of the reference template image and arranging the focusing areas at positions corresponding to the reference template image in the low-magnification image.

13. A method of inspecting a microstructure formed on a surface of a specimen, which method includes inspecting the microstructure by use of a charged particle beam focusing method, the charged particle beam focusing method being used for a charged particle beam apparatus, the charged particle beam apparatus generating a charged particle beam and then converging the charged particle beam by at least one of an electric field and a magnetic field, scanning a specimen to detect at least one of a secondary charged particle, a reflection charged particle and a back scattering charged particle generated from the specimen, and outputting a detection signal, the charged particle beam focusing method comprising:
arranging a plurality of focusing areas including edge points of the microstructure therein in a surface area of the specimen;
sequentially scanning the focusing areas with the charged particle beam to correspond to excitation conditions while changing stepwise the excitation conditions, the excitation conditions being conditions to excite at least one of the electric field and the magnetic field;
acquiring the detection signals for the excitation conditions and the focusing areas;
calculating an index indicating a convergence state of the charged particle beam in each excitation condition on the basis of the detection signal and calculating an optimum excitation condition providing an optimum focal position from the obtained index; and
converging the charged particle beam on the specimen under the optimum excitation condition.

14. The method of inspecting a microstructure according to claim 13,
wherein the focusing areas are scanned by a line scan; and
the index is an integration value of an absolute value of a difference or an integration value of an absolute value of a differential of the intensities of the detection signals between pixels adjacent to each other in a horizontal scan direction.

15. The method of inspecting a microstructure according to claim 13,
wherein the focusing areas are scanned by a raster scan; and
the index is an integration value of an absolute value of a difference or an integration value of an absolute value of a differential of the intensities of the detection signals between two-dimensionally adjacent pixels.

16. The method of inspecting a microstructure according to claim 13, wherein the charged particle beam focusing method further comprises preparing a reference template image in advance and applying the charged particle beam to the specimen at a low magnification to acquire a low-magnification image of the specimen, and wherein arranging the focusing areas in the surface area of the specimen includes implementing an image recognition of the low-magnification image by use of the reference template image and arranging the focusing areas at positions corresponding to the reference template image in the low-magnification image.

17. A semiconductor device manufacturing method to manufacture a semiconductor device using a charged particle beam focusing method for use in a charged particle beam apparatus, the charged particle beam apparatus generating a charged particle beam and then converging the charged particle beam by at least one of an electric field and a magnetic field, scanning a specimen having a microstructure formed on a surface thereof with the charged particle beam and detecting at least one of a secondary charged particle, a reflection charged particle and a back scattering charged particle generated from the specimen to output a detection signal, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

18. The semiconductor device manufacturing method according to claim 17, wherein the focusing areas are scanned by a line scan; and the index is an integration value of an absolute value of a difference or an integration value of an absolute value of a differential of the intensities of the detection signals between pixels adjacent to each other in a horizontal scan direction.

19. The semiconductor device manufacturing method according to claim 17, wherein the focusing areas are scanned by a raster scan; and the index is an integration value of an absolute value of a difference or an integration value of an absolute value of a differential of the intensities of the detection signals between two-dimensionally adjacent pixels.

20. A program for a charged particle beam apparatus comprising a control computer, the program being stored in a medium readable by the control computer of the charged particle beam apparatus, the charged particle beam apparatus generating a charged particle beam and then converging the charged particle beam by at least one of an electric field and a magnetic field, scanning a specimen having a microstructure formed on a surface thereof and detecting at least one of a secondary charged particle, a reflection charged particle and a back scattering charged particle generated from the specimen to output a detection signal, the program causing the control computer to execute a charged particle beam focusing method, the charged particle beam focusing method comprising:

arranging a plurality of focusing areas including edge points of the microstructure therein in a surface area of the specimen;

sequentially scanning the focusing areas with the charged particle beam to correspond to excitation conditions while changing stepwise the excitation conditions, the excitation conditions being conditions to excite at least one of the electric field and the magnetic field;

acquiring the detection signals for the excitation conditions and the focusing areas;

calculating an index indicating a convergence state of the charged particle beam in each excitation condition on the basis of the detection signal and calculating an optimum excitation condition providing an optimum focal position from the obtained index; and converging the charged particle beam on the specimen under the optimum excitation condition.

* * * * *